(12) United States Patent
Ding

(10) Patent No.: US 10,976,445 B2
(45) Date of Patent: Apr. 13, 2021

(54) METHOD FOR CONTROLLING FUNCTIONS OF A MEASUREMENT APPARATUS

(71) Applicant: Rohde & Schwarz GmbH & Co. KG, Munich (DE)

(72) Inventor: Chow Han Ding, Singapore (SG)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 175 days.

(21) Appl. No.: 16/138,760

(22) Filed: Sep. 21, 2018

(65) Prior Publication Data

US 2019/0113633 A1 Apr. 18, 2019

(30) Foreign Application Priority Data

Oct. 12, 2017 (DE) .......................... 102017218233.4

(51) Int. Cl.
| | |
|---|---|
| *G01S 19/52* | (2010.01) |
| *G01S 19/03* | (2010.01) |
| *G01R 1/02* | (2006.01) |
| *G06F 11/34* | (2006.01) |
| *G01R 1/00* | (2006.01) |
| *G01R 31/28* | (2006.01) |

(52) U.S. Cl.
CPC .............. *G01S 19/52* (2013.01); *G01R 1/025* (2013.01); *G01S 19/03* (2013.01); *G06F 11/3438* (2013.01); *G01R 1/00* (2013.01); *G01R 31/2834* (2013.01)

(58) Field of Classification Search
CPC .......... G01S 19/52; G01S 19/03; G01R 1/025
See application file for complete search history.

(56) References Cited

U.S. PATENT DOCUMENTS

| | | | | |
|---|---|---|---|---|
| 7,574,172 | B2* | 8/2009 | Clark .................... | B23K 9/0953 455/39 |
| 8,400,359 | B2* | 3/2013 | Liu ........................ | G01S 5/0289 342/463 |
| 8,583,146 | B2* | 11/2013 | Palanki .................... | H04W 4/33 455/456.6 |
| 8,618,978 | B2* | 12/2013 | Torimoto ................ | G01S 19/11 342/357.31 |
| 9,599,632 | B2 | 3/2017 | Yuen | |
| 10,146,196 | B2* | 12/2018 | Medelius .................. | A61B 5/01 |
| 10,420,475 | B2* | 9/2019 | Sinha ..................... | G16H 50/20 |
| 10,429,437 | B2* | 10/2019 | Helfman ............ | G01R 31/2834 |
| 2002/0038182 | A1* | 3/2002 | Wong ....................... | G01C 21/28 701/472 |
| 2006/0176828 | A1* | 8/2006 | Vasseur ................... | H04L 45/02 370/252 |

(Continued)

FOREIGN PATENT DOCUMENTS

| | | |
|---|---|---|
| CN | 106908643 A | 6/2017 |
| WO | 2013/144380 A2 | 10/2013 |

OTHER PUBLICATIONS

Extended European search report for European Patent Application No. 18190539.9, dated Feb. 26, 2019, 8 pages.

*Primary Examiner* — Marcus E Windrich
(74) *Attorney, Agent, or Firm* — Westman, Champlin & Koehler, P.A.

(57) ABSTRACT

A measurement apparatus comprising a controller configured to control functions of said measurement apparatus in response to retrieved user motion data (UMD) of at least one associated user of said measurement apparatus.

13 Claims, 3 Drawing Sheets

(56) References Cited

U.S. PATENT DOCUMENTS

| | | | |
|---|---|---|---|
| 2009/0048070 A1* | 2/2009 | Vincent | A63B 24/0062 |
| | | | 482/8 |
| 2010/0049525 A1* | 2/2010 | Paden | G10L 15/22 |
| | | | 704/270.1 |
| 2013/0127904 A1* | 5/2013 | Dove | G01K 1/024 |
| | | | 345/629 |
| 2013/0324154 A1* | 12/2013 | Raghupathy | G01S 5/0236 |
| | | | 455/456.1 |
| 2014/0099614 A1* | 4/2014 | Hu | G09B 19/00 |
| | | | 434/236 |
| 2014/0164611 A1* | 6/2014 | Molettiere | A61B 5/1112 |
| | | | 709/224 |
| 2014/0195980 A1 | 7/2014 | Lee | |
| 2015/0312719 A1* | 10/2015 | Cho | G01S 5/0263 |
| | | | 455/456.5 |
| 2016/0132202 A1* | 5/2016 | Hafizovic | G06F 3/0481 |
| | | | 715/762 |
| 2017/0083086 A1 | 3/2017 | Mazur et al. | |
| 2018/0246222 A1* | 8/2018 | Song | G01S 19/52 |
| 2020/0127920 A1* | 4/2020 | Miao | H04L 45/20 |
| 2020/0322920 A1* | 10/2020 | Vaidya | H04W 16/14 |

* cited by examiner

| $F_1$ | $U_A$ |
| --- | --- |
| $F_2$ | $U_A, U_B$ |
| ⋮ | ⋮ |
| $F_N$ | $U_C$ |

METHOD FOR CONTROLLING FUNCTIONS OF A MEASUREMENT APPARATUS

CROSS-REFERENCE TO RELATED APPLICATION

This application claims priority to German Patent Application No. 102017218233.4, filed on Oct. 12, 2017, the content of which are hereby incorporated by reference in its entirety.

FIELD OF THE INVENTION

The invention relates to a method for controlling functions of a measurement apparatus taking into account the motion of an associated user.

TECHNICAL BACKGROUND

A huge variety of different measurement apparatuses can perform different measurement functions. A measurement apparatus can be for instance an oscilloscope for measuring electrical signals. A measurement apparatus can also be used for performing test functions for testing devices under test DUT. In case that a measurement and/or test function generates a failure or a measurement result of a measurement function that indicates a failed component of a measured device under test DUT or of the measurement apparatus itself, the measurement apparatus or at least the affected function can be switched off to avoid further consequences such as a short circuit. For instance, a test failure can result in destroying other devices connected to the measurement apparatus. A test failure may cause a short circuit or even cause fire. If a certain test failure results in a possible destruction of another device or component it is necessary to react immediately. A user performing the test functions can only switch off or disable the affected function of the measurement apparatus if the user is within the vicinity of the measurement apparatus. However, an associated user in charge of the affected function of the measurement apparatus may not be in the same room as the measurement apparatus but currently in another room or building so that it may require some time before he can reach the measurement apparatus to control the affected functions of the measurement apparatus and to avoid unwanted consequences of the affected measurement function. A conventional measurement apparatus can be programmed to perform a shutdown of the whole measurement apparatus or at least of the affected functions based on certain predetermined criteria. However, such a conventional measurement apparatus cannot show an intelligent behaviour to take other not preprogrammed actions into account to handle the situation having arisen from the failed measurement function. A user in charge of the function performed by the measurement apparatus does know from his experience more accurately how to react to a failed test or measurement function and can foresee how urgent a reaction to a failed function of a measurement apparatus is. This experience and knowledge can translate into how the respective user reacts to a detected failure, in particular how the user moves in response to the notified measurement or test failure of the measurement apparatus. If the measurement or test failure of the measurement apparatus is severe a user will move relatively fast towards the affected measurement apparatus to overcome the affected failure. In contrast, if the detected failure of the measurement apparatus is less severe and has less or no consequences a user may move slowly towards the measurement apparatus or will not move at all.

A conventional measurement apparatus cannot react flexibly on different test or measurement situations and can only react according to the preprogrammed failure handling procedures based on certain predefined criteria.

SUMMARY OF THE INVENTION

Accordingly, there is a need it is an object of the present invention to provide a method and apparatus which provide a more flexible and matching reaction to a failed test or measurement function.

This object is achieved according to a first aspect of the present invention by a measurement apparatus having the features of claim 1.

The invention provides according to the first aspect a measurement apparatus comprising a controller configured to control functions of said measurement apparatus in response to retrieved user motion data of at least one associated user of the measurement apparatus.

In a possible embodiment of the measurement apparatus according to the first aspect of the present invention, the measurement apparatus comprises a wired or wireless interface to receive retrieved user motion data of the associated user.

In a still further possible embodiment of the measurement apparatus according to the first aspect of the present invention, the retrieved user motion data includes a relative position of the user with respect to the measurement apparatus, a moving direction of the user, a moving velocity of the user and/or an acceleration of the user.

In a further possible embodiment of the measurement apparatus according to the first aspect of the present invention, the functions controlled by the controller of the measurement apparatus in response to the retrieved user motion data of the associated user comprise operation modes of the measurement apparatus including power supply modes, shutdown modes, measurement modes and/or test modes of the measurement apparatus.

In a further possible embodiment of the measurement apparatus according to the first aspect of the present invention, the associated user carries a mobile device used to retrieve the user motion data of the associated user.

In a further possible embodiment of the measurement apparatus according to the first aspect of the present invention, the user motion data of the associated user is retrieved by a GNSS system and supplied to a wired or wireless interface of the measurement apparatus via a data network.

In a further possible embodiment of the measurement apparatus according to the first aspect of the present invention, the wireless interface of the measurement apparatus used for receiving the retrieved user motion data of the associated user comprises a Bluetooth interface, a near-field communication (NFC) interface, a Wi-Fi interface and/or a wireless local area network (WLAN) interface.

The invention further provides according to a second aspect a method for controlling functions of a measurement apparatus comprising the features of claim 9.

The invention provides according to the second aspect a method for controlling functions of a measurement apparatus comprising the steps of:
retrieving user motion data of at least one associated user of the measurement apparatus and controlling functions of the measurement apparatus at least partially in response to the retrieved user motion data.

In a possible embodiment of the method according to the second aspect of the present invention, the user motion data of the associated user is automatically retrieved in response to a request issued by the measurement apparatus.

In a possible embodiment of the method according to the second aspect of the present invention, the request to retrieve the user motion data is triggered by a triggering event, in particular a failure of a function of the measurement apparatus and/or by a measurement result of a function of the measurement apparatus.

In a still further possible embodiment of the method according to the aspect of the present invention, the retrieved user motion data of the associated user is transmitted by a mobile device carried by the user directly via a wireless link or via a network to an input interface of the measured apparatus.

BRIEF DESCRIPTION OF THE DRAWINGS

In the following, possible embodiments of the different aspects of the present invention are described in more detail with respect to the enclosed figures.

DESCRIPTION OF EMBODIMENTS

Figure 1:
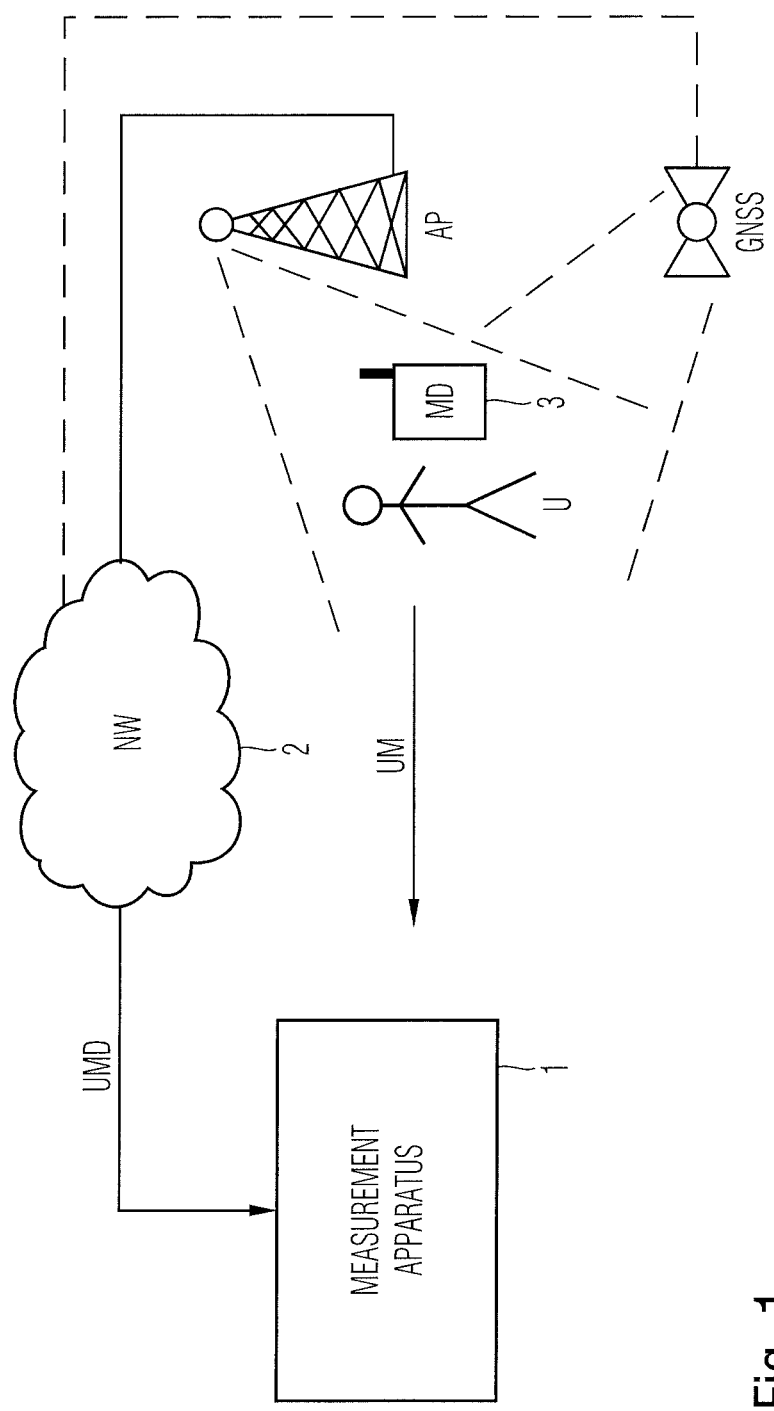
FIG. 1 shows a diagram for illustrating a possible exemplary embodiment of a measurement apparatus according to the first aspect of the present invention.
Figures 3, 4:
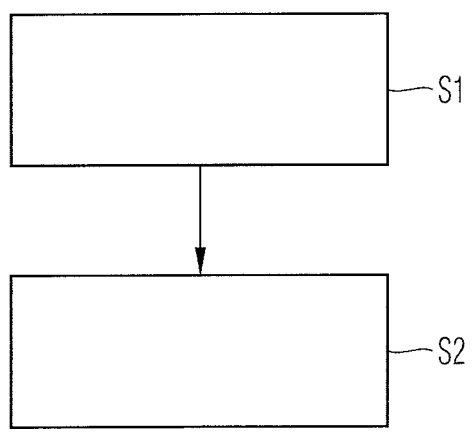
FIG. 3 shows a table for illustrating a possible exemplary embodiment of a measurement apparatus according to the first aspect of the present invention.
FIG. 4 shows a flowchart of a possible exemplary embodiment of a method for controlling functions of a measurement apparatus according to a second aspect of the present invention.

As can be seen in FIG. 1, a measurement apparatus 1 according to the first aspect of the present invention may form part of a measurement system comprising one or several measurement apparatuses or measurement devices. In the illustrated embodiment of FIG. 1, the measurement apparatus 1 is configured to perform different functions F including measurement functions, test functions and/or control functions. The measurement apparatus 1 has at least one associated user U being in charge of one or several functions of the measurement apparatus 1. The measurement apparatus 1 can comprise a single associated user U who is in charge of all functions of the measurement apparatus 1. In a further possible embodiment, the measurement apparatus 1 can comprise different functions having different associated users U as also illustrated in the table of FIG. 3. The measurement apparatus 1 comprises an integrated controller which is adapted to control the different functions of the measurement apparatus 1. These functions are controlled in response to retrieved user motion data UMD of the at least one associated user U of the measurement apparatus 1. The measurement apparatus 1 comprises at least one wired or wireless input interface to receive the retrieved user motion data UMD of the associated user U as also illustrated in FIG. 1. The retrieved user motion data UMD can include in a possible embodiment a relative position of the user U with respect to the measurement apparatus 1. The retrieved user motion data UMD can further comprise a moving direction of the user U, a moving velocity of the user U and an acceleration of the user U. In the schematic diagram of FIG. 1, the user U is moving towards the measurement apparatus 1 with a velocity V. In the illustrated embodiment of FIG. 1, the user U carries a mobile device MD which can be used to retrieve the user motion data UMD. The mobile device MD can be in a possible embodiment a specific mobile device MD belonging to the measurement equipment or measurement system. In an alternative embodiment, the mobile device MD can be a universal mobile device such as a smartphone. In a mobile telecommunication network, it is possible to detect the current position of a mobile device MD such as a smartphone carried by a user U. The smartphone can be logged in at an access point of a cellular mobile communication network. This communication network can also be used to notify the user U carrying the mobile device MD about a failed function of the measurement apparatus 1. In a possible embodiment, a failure of a function of the measurement apparatus 1 forms a triggering event which triggers a request to retrieve the user motion data UMD of the associated user U. This request can be forwarded via the network to the mobile device MD carried by the user U. In a possible embodiment, the user U may receive a message indicating the failure of the function of the measurement apparatus 1 on a user interface of the mobile device MD. The user U reacts to the notified failure of the measurement apparatus 1 individually. If the notified failure indicated in the received message is severe the user U will normally move fast towards the affected measurement apparatus 1. If the detected misfunction or failure is severe the user U may even run towards the measurement apparatus 1 to avoid further consequences. The motion of the user U after having received the notification or message indicating the failure can be monitored and observed by one or different systems. In a possible embodiment, the motion of the user U can be retrieved from the position data or coordinates of a mobile device MD carried by the user U. Further, it is possible that the user motion data UMD of the associated user U is retrieved by a GNSS system and supplied to an input interface of the measurement apparatus 1 via a data network as also illustrated in FIG. 1. In a possible embodiment, the data network can comprise the Internet connected via gateways to the telecommunication network and/or to a satellite system. The measurement apparatus 1 can be connected to the network 2 as shown in FIG. 1 via a wired or wireless link. Further, the measurement apparatus 1 can also receive user motion data UMD from the mobile device 3 of the user U via a wireless link if the user U is relatively close to the measurement apparatus 1. In a still further possible embodiment, the measurement apparatus 1 can also comprise sensing entities adapted to sense the motion of the user U relative to the measurement apparatus 1 in response to a notified measurement or test failure of the measurement apparatus 1. This sensor can comprise a camera which receives camera images of an associated user U of the measurement apparatus 1 in case that the user U is in the same. If the user U is not in the same room as the measurement apparatus 1 the motion of the user U in response to a notified test or measurement failure can be notified to the measurement apparatus 1 via a network 2 as illustrated in FIG. 1. If the user U moves within a cell of a mobile telecommunication network the position data of his mobile device 3 can be detected and supplied via the data network 2 to the measurement apparatus 1. If the user U is moving in the field in an area where there is no coverage of a mobile telecommunication system a satellite system GNSS can be used to detect the motion of the user U after having received a test failure notification. In a possible embodiment, the user motion data UMD is retrieved in response to a request issued by the measurement apparatus 1. In an alternative embodiment, the user motion data UMD of the associated user U is supplied continuously to the measurement apparatus 1 so that the user information data UMD is instantaneously available when a test or measurement failure of a function of the measurement apparatus 1 does occur. The measurement apparatus 1 is configured to actively sense a motion of an associated key user U. The measurement apparatus 1 can comprise a processing unit adapted to process the user motion data UMD received from one or several users U via an input interface. From the current position data of the user U, a velocity and/or an acceleration of the user U as well as a direction of his movement can be derived by the processing unit of the measurement apparatus 1. If the moving direction of the user U is straight to the measurement apparatus 1 and if the user motion data UMD of the user U indicate that the user U is moving in a hurry and with high velocity towards the measurement apparatus 1 this forms an indication that the notified failure of the measurement apparatus 1 has a high priority. The control unit or controller of the measurement apparatus 1 reacts accordingly taking into account the information carried by the received user motion data UMD. The functions controlled by the controller of the measurement apparatus 1 in response to the retrieved user motion data UMD can comprise operation modes of the measurement apparatus 1. These operation modes can include power supply modes, shutdown modes, measurement modes and/or test modes of the measurement apparatus 1. For instance, the measurement apparatus 1 can turn to a lower power supply mode if it is determined by the controller that the associated user U of the measurement apparatus 1 is walking at a comparatively low speed towards the measurement apparatus 1 in response to a notified test failure. In contrast, if the received user motion data UMD indicates that the user U is running towards the measurement apparatus 1 in response to a notified failure a complete and fast shutdown of the affected function of the measurement apparatus or of the whole measurement apparatus 1 can be initiated immediately by the controller of the measurement apparatus 1. If it is detected that the associated user U does not move at all in reaction to a notified failure the affected function can be treated in another way or manner. The operation modes affected by the detected motion of the user U may comprise shutdown modes, power supply modes, measurement modes, test modes, measurement setups as well as parameters of the measurement apparatus 1. Also, the operation of other devices controlled by the controller of the measurement apparatus 1, in particular devices under test DUT can be adapted or influenced by the retrieved user motion data UMD of the associated user U in charge.

Figure 2:
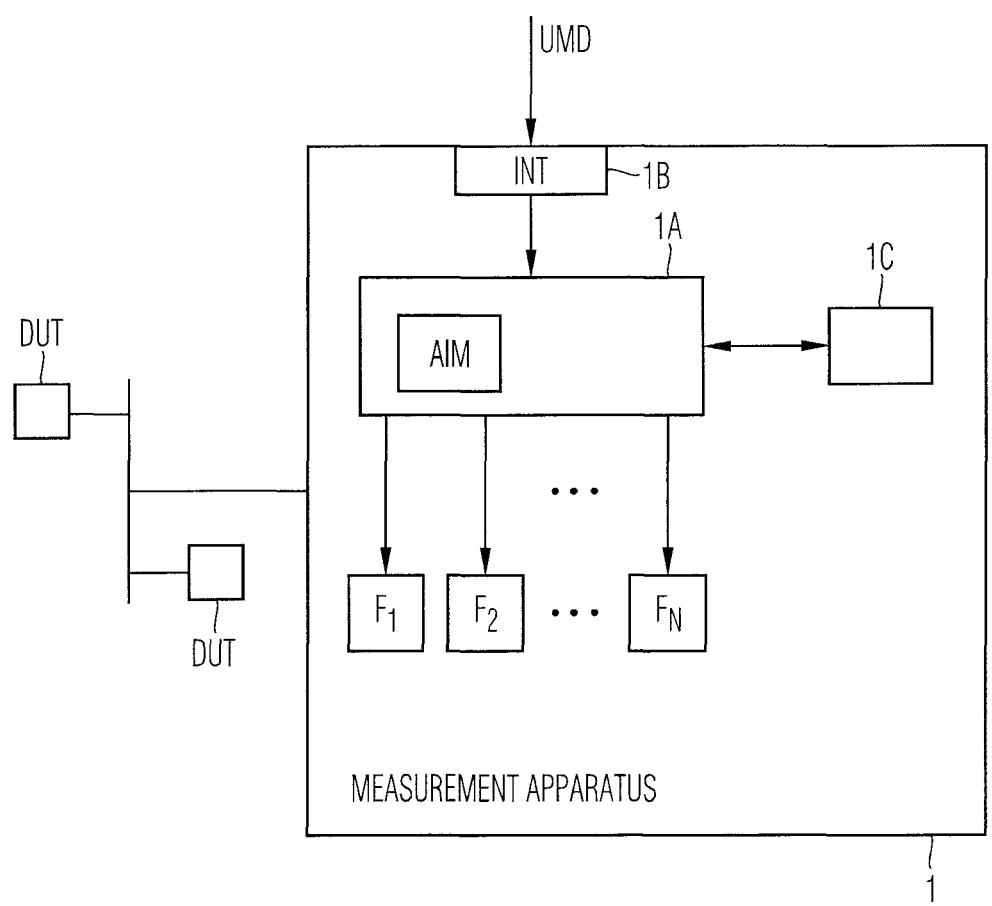
FIG. 2 shows a block diagram of a possible exemplary embodiment of a measurement apparatus according to the first aspect of the present invention.

FIG. 2 shows a block diagram of a possible exemplary embodiment of a measurement apparatus 1 according to the first aspect of the present invention. As can be seen in the illustrated embodiment of FIG. 2, the measurement apparatus 1 comprises an integrated controller 1A adapted to control a plurality of different functions F1 to $F_n$ of the measurement apparatus 1. These functions can comprise for instance test functions, measurement functions and/or control functions. The controller 1A of the measurement apparatus 1 can also control external entities, in particular external devices such as devices under test DUT as illustrated in FIG. 2. In a possible embodiment, the controller 1A of the measurement apparatus 1 receives via an input interface 1B the user motion data UMD of an associated user U. The interface 1B can be a wired or a wireless interface.

The controller 1A of the measurement apparatus 1 has access in a possible embodiment to a configuration memory 1C as illustrated in FIG. 2.

FIG. 3 shows a table for illustrating possible data content of the configuration memory 1C shown in FIG. 2. As can be seen in FIG. 3, the measurement apparatus 1 can comprise a plurality of different functions F1 to $F_n$ wherein each function comprises at least one associated user U. In the example indicated in FIG. 3, a first function F1 of the measurement apparatus 1 has the associated user $U_A$. The second function F2 comprises two associated users $U_A$, $U_B$. The last function $F_n$ of the measurement apparatus 1 has the associated user $U_C$. Accordingly, if the first function F1 fails user information data UID of the associated user $U_A$ is retrieved and evaluated by the controller or processing unit 1A of the measurement apparatus 1. The affected function F1 is controlled by the controller 1A in response to the retrieved user motion data UMD of the associated user $U_A$. In the example given in FIG. 3, the second function F2 comprises two different associated users $U_A$, $U_B$. Accordingly, if a failure mode of the second function F2 occurs the user motion data UMD of both associated users $U_A$, $U_B$ is retrieved and evaluated to control a reactive function to handle the occurred failure or function F2. For instance, if two different associated users $U_A$, $U_B$ start simultaneously to run towards the measurement apparatus 1 in reaction to a notified fault this is a strong hint that the occurred failure is severe. In contrast, if for instance a fault or function F2 has been notified to both users $U_A$, $U_B$ and one of the users remains at his current position whereas the other user $U_B$ moves slowly towards the measurement apparatus 1 this can be an indication that the notified fault is of less importance.

FIG. 4 shows a flowchart of a possible exemplary embodiment of a method for controlling functions of a measurement apparatus 1 according to the second aspect of the present invention.

In the illustrated embodiment, the method comprises two main steps.

In a first step S1, user motion data UMD of at least one associated user U of a measurement apparatus such as the measurement apparatus 1 is retrieved. In a possible embodiment, the user motion data UMD of the associated user U can be automatically retrieved in response to a request issued by the measurement apparatus 1. In a possible embodiment, such a request to retrieve the user motion data UMD of the associated user U can be triggered by a triggering event. This triggering event comprises in a possible embodiment a detected failure of a function F of the measurement apparatus 1. In a further possible embodiment, the triggering event can be a measurement and/or test result of a function F of the measurement apparatus 1. The user motion data UMD of the associated user U retrieved in step S1 can be transmitted in a possible embodiment by a mobile device 3 carried by the user U to the measurement apparatus 1. The retrieved user motion data UMD can be transmitted in a possible embodiment directly via a wireless link from the mobile device 3 to a wireless input interface of the measurement apparatus 1. It is also possible that the retrieved user motion data UMD is transported indirectly via a data network such as an Internet to a wired interface of the measurement apparatus 1.

In a further step S2, functions F of the measurement apparatus 1 are controlled at least partially in response to the retrieved user motion data UMD of the associated user U. This can include a change of an operation mode of the measurement apparatus 1. The function control in step S2 can for instance include a change of a power supply mode, a shutdown mode, a measurement mode and/or a test mode of the measurement apparatus 1. In a possible embodiment, the control of the functions F performed in step S2 includes the affected function having caused the triggering event and/or other functions of the measurement apparatus 1 detected directly or indirectly by the determined triggering event. In a further possible embodiment of the measurement apparatus 1 according to the present invention, the controller 1A can comprise an artificial intelligence module AIM which can be trained by different detected user motion profiles observed in the past and/or provided by a database. For instance, in a possible embodiment, the measurement apparatus 1 can learn from the motion pattern of the associated user U that a specific affected malfunction has a high priority and requiring an immediate shutdown of the complete measurement apparatus 1. The artificial intelligence module of the controller 1A can be trained on a training set of motion patterns and can improve its performance continuously on the basis of motion patterns of one or different associated users U during its operation lifetime. The artificial intelligence module AIM can be integrated in the controller or processing unit 1A of the measurement apparatus 1.

The user motion data UMD of an associated user U can be retrieved in different ways. In a possible embodiment, the user motion data UMD is retrieved using the coordinates and position of a mobile device 3 carried by the user U. In a further possible embodiment, the user motion data UMD can be retrieved directly by sensing the motion of the user U within the vicinity of the measurement apparatus 1. In this embodiment, the user motion data UMD can be retrieved on the basis of sensor data such as radar sensor data and/or image data of captured images. The measurement apparatus 1 according to the first aspect of the present invention can be any kind of measurement apparatus such as an oscilloscope or a test apparatus. The measurement apparatus 1 according to the present invention forms a smart measurement apparatus which takes into account the behaviour of at least one associated user U in charge of at least one measurement function in response to a notified failure of a measurement function. The controller 1A of the measurement apparatus 1 is adapted to interpret the behaviour and movement of the user U after having received a notification of a failure or fault of the measurement apparatus 1.

In a still further possible embodiment of the measurement apparatus 1 according to the present invention, the behaviour of the user U can be determined taking into account also the body language and/or the facial expression of the user U. If the associated user U is in the vicinity of the measurement apparatus 1 a camera can capture images of the face of the operating user. If the face shows distress or panic, this is a clear indication that the notified malfunction is severe and has to be handled with utmost priority. In contrast, if the facial expression of the user remains relaxed the function affected by the fault can be handled with less priority and with less drastic measures.

What I claim is:

1. A measurement apparatus configured to perform test functions for testing devices under test, the measurement apparatus comprising:
   a wired or wireless interface to receive retrieved user motion data of at least one associated user of said measurement apparatus, wherein the retrieved user motion data includes at least one of:
   a moving direction of the user,
   a moving velocity of the user, and
   an acceleration of the user, and
   a controller configured to control functions of said measurement apparatus in response to said retrieved user motion data;
   wherein the measurement apparatus is adapted to notify the at least one associated user carrying a mobile device about a failure of a function of the measurement apparatus via a communication network;
   wherein the measurement apparatus is configured to trigger a request to retrieve the user motion data of the at least one associated user in response to the failure of a function of the measurement apparatus; and
   wherein the measurement apparatus is configured to turn to a lower power supply mode if the controller determines that the associated user of the measurement apparatus is walking towards the measurement apparatus at a moving velocity that is lower as compared to a threshold.

2. The measurement apparatus of claim 1, wherein the retrieved user motion data further includes a relative position of the user with respect to the measurement apparatus.

3. The measurement apparatus of claim 1, wherein the functions controlled by said controller in response to the retrieved user motion data comprise operation modes of said measurement apparatus including at least one of:
   power supply modes of said measurement apparatus;
   shutdown modes of said measurement apparatus;
   measurement modes of said measurement apparatus;
   test modes of said measurement apparatus.

4. The measurement apparatus of claim 1, wherein the associated user of said measurement apparatus carries a mobile device used to retrieve the user motion data of the associated user.

5. The measurement apparatus of claim 1, wherein the user motion data of the associated user is retrieved by a GNSS system and supplied to a wired or wireless interface of the measurement apparatus via a data network.

6. The measurement apparatus of claim 1, wherein a wireless interface of said measurement apparatus used for receiving the retrieved user motion data of the associated user comprises at least one of:
   a Bluetooth interface;
   a NFC interface;
   a Wi-Fi interface;
   a WLAN interface.

7. The measurement apparatus of claim 1, wherein the apparatus comprises an artificial intelligence module.

8. A method for controlling functions of a measurement apparatus configured to perform test functions for testing devices under test, the method comprising the steps of:
   notifying at least one associated user of said measurement apparatus, the at least one user carrying a mobile device, about a failure of a function of the measurement apparatus via a communication network;
   triggering a request to retrieve user motion data of the at least one associated user of said measurement apparatus in response to the failure of a function of the measurement apparatus;
   retrieving the user motion data of the at least one associated user of said measurement apparatus using a wired or wireless interface, wherein the retrieved user motion data includes at least one of:
   a moving direction of the user,
   a moving velocity of the user, and
   an acceleration of the user, and
   controlling functions of said measurement apparatus at least partially in response to the retrieved user motion data;

wherein the measurement apparatus is turned to a lower power supply mode if it is determined that the associated user of the measurement apparatus is walking towards the measurement apparatus at a moving velocity that is lower as compared to a threshold.

9. The method of claim 8, wherein the user motion data of the associated user is automatically retrieved in response to a request issued by said measurement apparatus.

10. The method of claim 9, wherein the request to retrieve the user motion data is triggered by a triggering event.

11. The method of claim 10, wherein the request to retrieve the user motion data is triggered by a malfunction of the measurement apparatus.

12. The method of claim 10, wherein said measurement apparatus comprises a function that provides measurement results, and wherein the request to retrieve the user motion data is triggered by a measurement result of said function of the measurement apparatus.

13. The method of claim 8, wherein the retrieved user motion data of the associated user is transmitted by a mobile device carried by the user directly via a wireless link or via a network to an input interface of said measured apparatus.

* * * * *